(12) United States Patent
Yau et al.

(10) Patent No.: US 10,916,626 B2
(45) Date of Patent: Feb. 9, 2021

(54) HIGH VOLTAGE POWER DEVICE WITH HYBRID SCHOTTKY TRENCHES AND METHOD OF FABRICATING THE SAME

(71) Applicant: Hong Kong Applied Science and Technology Research Institute Co., Ltd., Shatin (HK)

(72) Inventors: Shu Kin Yau, Junk Bay (HK); Siu Wai Wong, Junk Bay (HK)

(73) Assignee: Hong Kong Applied Science and Technology Research Institute Co., Ltd., Shatin (HK)

( * ) Notice: Subject to any disclaimer, the term of this patent is extended or adjusted under 35 U.S.C. 154(b) by 28 days.

(21) Appl. No.: 16/235,339

(22) Filed: Dec. 28, 2018

(65) Prior Publication Data

US 2020/0212177 A1 Jul. 2, 2020

(51) Int. Cl.
*H01L 29/06* (2006.01)
*H01L 29/16* (2006.01)
*H01L 29/66* (2006.01)
*H01L 29/872* (2006.01)

(52) U.S. Cl.
CPC ...... *H01L 29/0661* (2013.01); *H01L 29/1608* (2013.01); *H01L 29/6606* (2013.01); *H01L 29/66143* (2013.01); *H01L 29/872* (2013.01)

(58) Field of Classification Search
CPC ..... H01L 2924/12032; H01L 29/66143; H01L 29/66212; H01L 29/872; H01L 29/8725; H01L 51/0579; H01L 27/0766
See application file for complete search history.

(56) References Cited

U.S. PATENT DOCUMENTS

| 5,929,467 A | 7/1999 | Kawai et al. |
| 6,140,169 A | 10/2000 | Kawai et al. |

(Continued)

FOREIGN PATENT DOCUMENTS

| CN | 103094358 | 5/2013 |
| CN | 108063090 | 5/2018 |

(Continued)

OTHER PUBLICATIONS

WO PCT/CN2019/072016 Search Rept., dated Sep. 27, 2019, Hong Kong Applied Sci & Tech I.

(Continued)

*Primary Examiner* — Jonathan Han
(74) *Attorney, Agent, or Firm* — Wells St. John P.S.

(57) ABSTRACT

A silicon carbide diode that contains a silicon carbide substrate, a silicon carbide layer on top of the silicon carbide substrate, two first lower barrier metal portions disposed on the silicon carbide layer and separated from each other along a top surface of the silicon carbide layer, and a first higher barrier metal portion connected to the two lower barrier metal portions. The silicon carbide layer is thinner and having lower doping than the silicon carbide substrate. The first higher barrier metal portion is located between the two first lower barrier metal portions on the silicon carbide layer along a direction of the top surface of the silicon carbide layer. By reducing the leakage current at the junction barrier, the reverse breakdown voltage of the silicon carbide diode is significantly improved.

18 Claims, 5 Drawing Sheets

(56) References Cited

U.S. PATENT DOCUMENTS

| | | | |
|---|---|---|---|
| 6,362,495 B1 * | 3/2002 | Schoen | H01L 29/1608 257/471 |
| 6,562,706 B1 | 5/2003 | Liu et al. | |
| 7,915,703 B2 | 3/2011 | Henning et al. | |
| 7,955,961 B2 * | 6/2011 | Richieri | H01L 29/47 438/580 |
| 8,368,165 B2 | 2/2013 | Richieri | |
| 8,878,327 B2 | 11/2014 | Yen et al. | |
| 9,406,661 B2 | 8/2016 | Zhu et al. | |
| 2010/0289109 A1 * | 11/2010 | Henning | H01L 29/872 257/486 |
| 2017/0154953 A1 * | 6/2017 | Wada | H01L 29/66068 |
| 2017/0221714 A1 * | 8/2017 | Wakimoto | H01L 29/1095 |

FOREIGN PATENT DOCUMENTS

| | | |
|---|---|---|
| CN | 207637806 | 7/2018 |
| JP | H10-223901 | 8/1998 |
| TW | 415111 | 12/2000 |
| WO | WO 2010/132403 | 11/2010 |

OTHER PUBLICATIONS

WO PCT/CN2019/072016 Writ. Opin., dated Sep. 27, 2019, Hong Kong Applied Sci & Tech I.

* cited by examiner

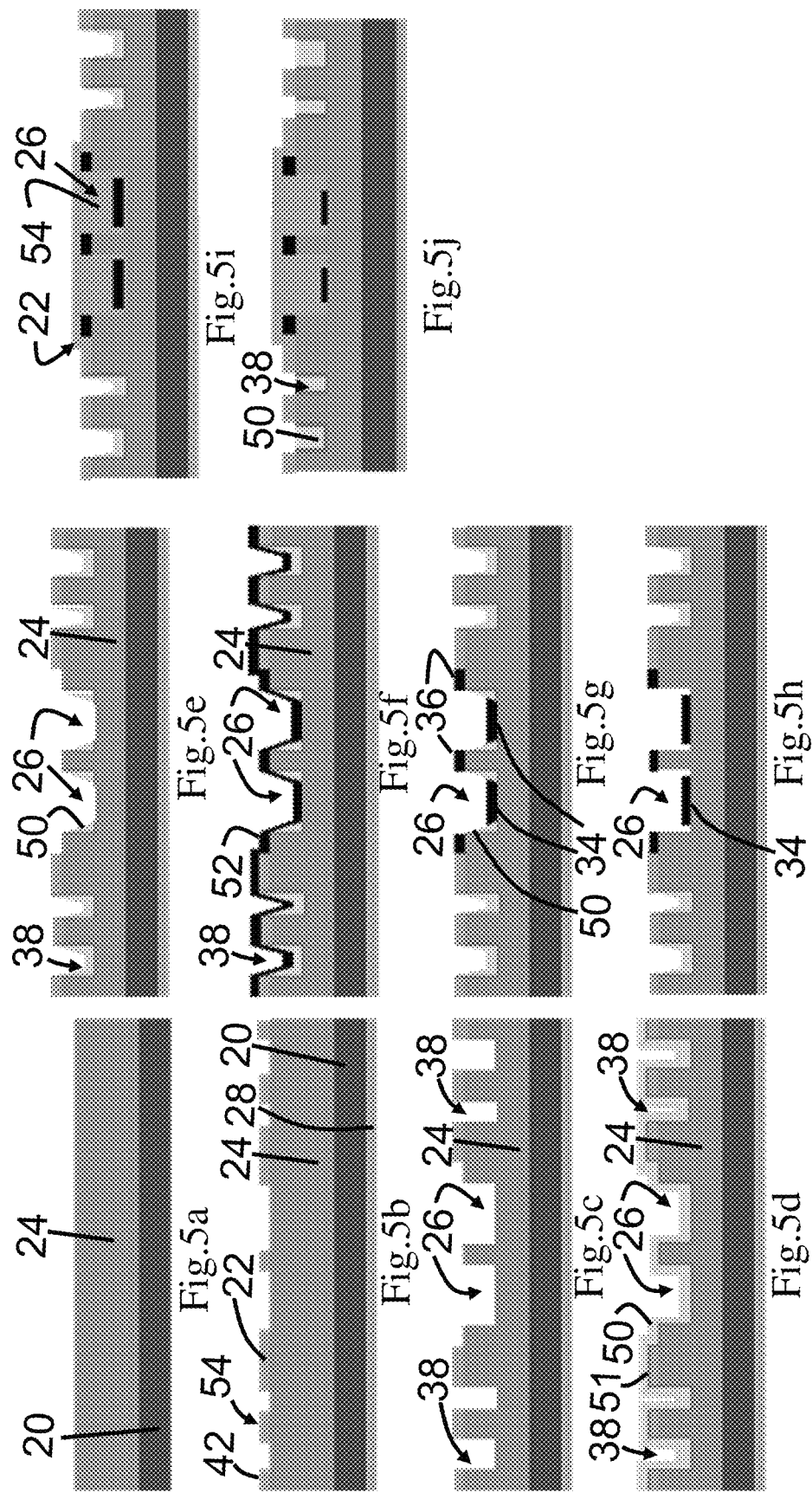

HIGH VOLTAGE POWER DEVICE WITH HYBRID SCHOTTKY TRENCHES AND METHOD OF FABRICATING THE SAME

FIELD OF INVENTION

This invention relates to semiconductor devices, and in particular to silicon carbide diodes.

BACKGROUND OF INVENTION

Silicon Carbide (SiC) devices belong to the so-called wide band gap semiconductor group, and they offer a number of attractive characteristics for high voltage power semiconductors when compared to commonly used silicon (Si). In particular, the much higher breakdown field strength and thermal conductivity of SiC make them essential for power electronics systems. These diodes have static performances comparable to those manufactured from silicon. Moreover, silicon carbide based Schottky diodes do not suffer from switching losses.

However, existing silicon carbide diodes often suffer from other problems including but not limited to large leakage current and low reverse breakdown voltage, which deteriorate the performance of the silicon carbide diodes. If the diode leakage current is high, the blocking voltage will be low. Therefore, improvement of leakage current is needed for higher blocking voltage applications.

SUMMARY OF INVENTION

In the light of the foregoing background, it is an object of the present invention to provide an alternate silicon carbide diode array which eliminates or at least alleviates the above technical problems.

The above object is met by the combination of features of the main claim; the sub-claims disclose further advantageous embodiments of the invention.

One skilled in the art will derive from the following description other objects of the invention. Therefore, the foregoing statements of object are not exhaustive and serve merely to illustrate some of the many objects of the present invention.

Accordingly, the present invention, in one aspect is a silicon carbide diode that contains a silicon carbide substrate, a silicon carbide layer on top of the silicon carbide substrate, two first lower barrier metal portions disposed on the silicon carbide layer and separated from each other along a top surface of the silicon carbide layer, and a first higher barrier metal portion connected to the two lower barrier metal portions. The silicon carbide layer is thinner and having lower doping than the silicon carbide substrate. The first higher barrier metal portion is located between the two first lower barrier metal portions on the silicon carbide layer along a direction of the top surface of the silicon carbide layer.

Preferably, the silicon carbide diode further includes a second higher barrier metal portion. The first and second higher barrier metal portions are configured with the two first lower barrier metal portions in an alternating manner at the top surface of the silicon carbide layer, such that the first higher barrier metal portion and the second higher barrier metal portion are separated by one of the two first lower barrier metal portions.

More preferably, the first higher barrier metal portion and the second higher barrier metal portion further extend downwardly into the silicon carbide layer to form two first trenches.

Most preferably, the silicon carbide diode further contains second lower barrier metal portions located at the bottom ends of the first trenches.

According to a variation of the preferred embodiments, the silicon carbide diode further contains a higher barrier metal cap, which together with the silicon carbide layer, fully encapsulates the first lower barrier metal portions.

According to another variation of the preferred embodiments, the first higher barrier metal portion further extends downwardly into the silicon carbide layer to form a first trench.

According to a further variation of the preferred embodiments, the silicon carbide diode further contains a second trench separated from an active region defined by the first higher barrier metal portion and the two first lower barrier metal portions. The second trench is formed by a dielectric material.

Preferably, the silicon carbide diode further contains a plurality of the second trenches which are separated from each other. Each second trench forms a closed shape when viewing from above.

More preferably, the plurality of the second trenches forms a plurality of concentric rings.

According to a further variation of the preferred embodiments, the plurality of the second trenches is separated from each other by one or more third higher barrier metal portions.

According to a further variation of the preferred embodiments, the silicon carbide diode further contains an aluminum compound buffer as an interface between the second trench and the silicon carbide layer.

According to another aspect of the invention, there is disclosed a silicon carbide diode which contains a silicon carbide substrate, a silicon carbide layer on top of the silicon carbide substrate, an active region defined by at least one barrier metal which is formed on the silicon carbide layer; and a plurality of trenches formed inside the silicon carbide layer, and separated from the active region along a direction of a top surface of the silicon carbide layer. The silicon carbide layer is thinner and having lower doping than the silicon carbide substrate. Each trench forms a closed shape when viewing from above; and each trench is formed by a dielectric material. There is further a plurality of the barrier metal formed on the silicon carbide layer outside the active region; wherein each said barrier metal forming a closed shape and being located in between two of the plurality of trenches in when viewing from above.

Preferably, the silicon carbide diode further contains an aluminum compound buffer at an interface between the second trench and the silicon carbide layer.

According to another aspect of the invention, there is disclosed a method of producing a silicon carbide diode. The method includes the steps of providing a silicon carbide layer on top of a silicon carbide substrate, forming a first trench and a second trench inside the silicon carbide layer, depositing a lower barrier metal on a top surface of the silicon carbide layer in the active region, which covers the first trench, an depositing a higher barrier metal on the top surface of the silicon carbide layer in the active region, which covers the first trench. The first trench is a part of an active region of the silicon carbide diode. The second trench is separated from the first trench. The silicon carbide layer is thinner and having lower doping than the silicon carbide substrate.

Preferably, the forming step above further includes forming a plurality of second trenches that are separated from the first trench and from each other, each said second trench forming a closed shape.

More preferably, the step of depositing a higher barrier metal above further contains depositing the higher barrier metal on portions of the silicon carbide layer surrounding openings of the plurality of second trenches.

According to a variation of the preferred embodiments, the step of forming a first trench and a second trench further contains forming a plurality of first trenches that are separated from the second trench, and from each other by at least one portion of the silicon carbide layer.

According to another variation of the preferred embodiments, the step of depositing a lower barrier metal further contains the step of depositing the lower barrier metal on a bottom surface of the first trench, as well as on portions of the silicon carbide layer surrounding an opening of the first trench.

According to a further variation of the preferred embodiments, the method further contains the step of filling the first trench with the higher barrier metal.

According to a further variation of the preferred embodiments, the method further contains the step of filling the second trench with a dielectric material.

According to a further variation of the preferred embodiments, the method further contains the step of forming a buffer layer at the interface between the second trench and the silicon carbide layer.

One can see therefore that the silicon carbide diode in the invention contains a number of innovative changes to the semiconductor structure, each of which helping with reducing the leakage current at the junction barrier. When these innovative changes are combined the resultant silicon carbide diode has a significantly smaller leakage current compared to conventional devices, thus achieving a higher block voltage. For example, forming trenches in the silicon carbide layer and filling them with dielectric materials reduces the electrical field at the junction barrier and the leakage current, but adding a buffer layer further alleviates the current leakage. Similarly, forming multiple trenches around the active region, and forming multiple hybrid Schottky trenches within the active region both help reducing the leakage current at the junction barrier. It should be noted that the innovative changes can be used freely in any combinations thereof although the best performance is achieved using the configuration in the most preferred embodiment.

In addition, the manufacturing method of the proposed silicon carbide diode in the invention is advantageous not only because of a cost reduction compared to conventional processes, but more importantly the technique of depositing trench metal in a self-aligned way and the technique of void free termination filling help achieve a reduction in leakage current and a high breakdown voltage, while keeping the manufacturing cost relatively low. In comparison, ion implantation used in conventional art to achieve similar metal deposition effect is much costlier.

BRIEF DESCRIPTION OF FIGURES

The foregoing and further features of the present invention will be apparent from the following description of preferred embodiments which are provided by way of example only in connection with the accompanying figures, of which:

FIGS. 5a-5j show the method steps of one method which can be used to form the silicon carbide diode array in FIG. 1.

In the drawings, like numerals indicate like parts throughout the several embodiments described herein.

DETAILED DESCRIPTION OF THE PREFERRED EMBODIMENTS

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

As used herein and in the claims, "couple" or "connect" refers to electrical coupling or connection either directly or indirectly via one or more electrical means unless otherwise stated.

Terms such as "horizontal", "vertical", "upwards", "downwards", "above", "below" and similar terms as used herein are for the purpose of describing the invention in its normal in-use orientation and are not intended to limit the invention to any particular orientation.

Figure 1:
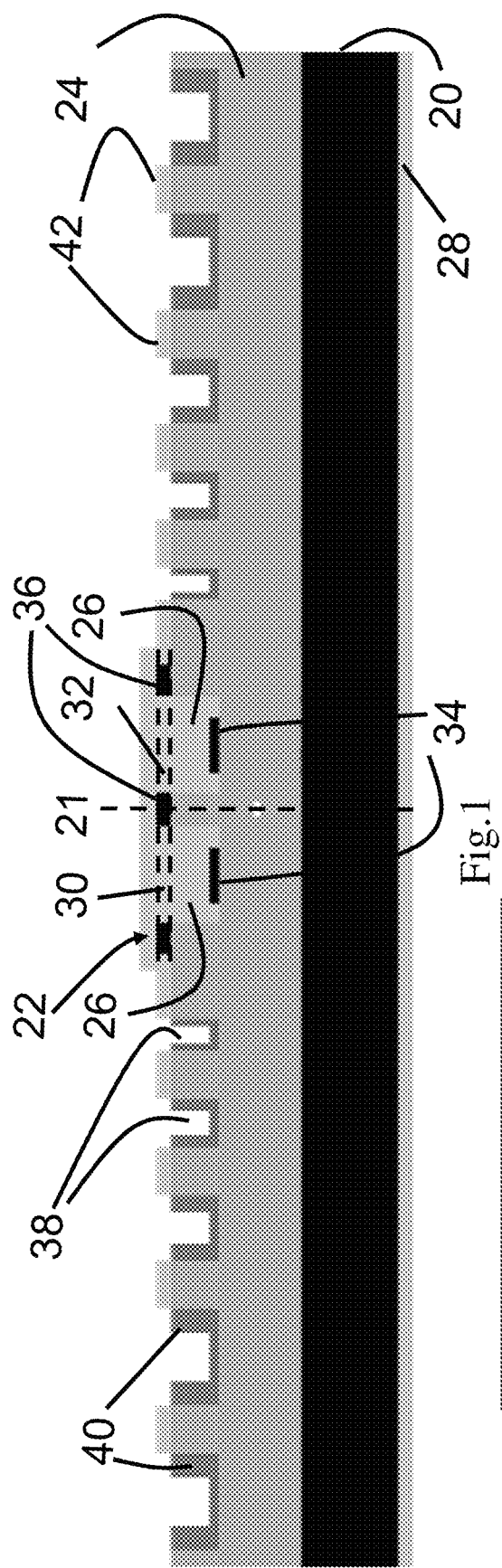
FIG. 1 is the cross-sectional illustration of a silicon carbide diode according to a first embodiment of the present invention.
Figure 2B:
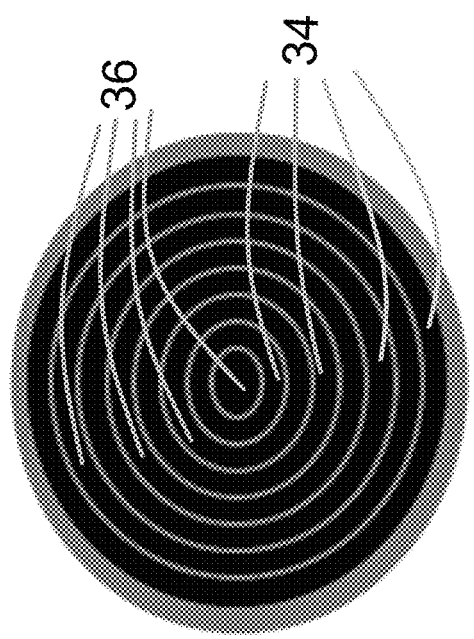
FIG. 2b is a simplified top view of the silicon carbide diode in FIG. 1 showing only the layout of barrier metals.

Referring now to FIGS. 1-2b, the first embodiment of the present invention is a silicon carbide diode of Schottky type, which contains a silicon carbide substrate 20 as the underlying structure of the device. As skilled persons would understand, the silicon carbide substrate 20 is made from SiC wafers, and the silicon carbide substrate 20 is of n+ type. On top of the silicon carbide substrate 20, there is a silicon carbide epitaxial layer 24 of n-type. The silicon carbide layer 24 is thinner and has lower doping than the silicon carbide substrate 20.

Figure 4:
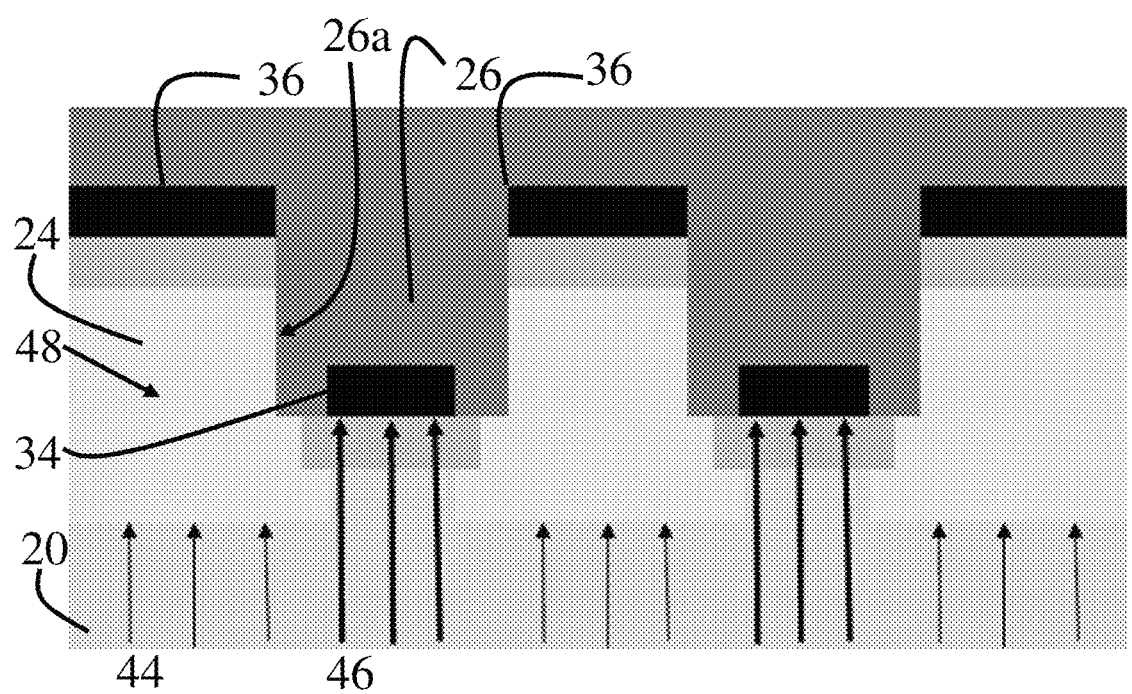
FIG. 4 is an illustration of the leakage current flows in the active region of the silicon carbide diode of FIGS. 1-2b.

Underneath the silicon carbide substrate 20, there is a layer of ohmic metal 28 forming a cathode of the silicon carbide diode. On the other side, at a center area of the device there are also junction barrier metals forming an anode of the silicon carbide diode. In particular, two different types of barrier metals, including a high barrier metal and a lower barrier metal, form hybrid Schottky metals of the silicon carbide diode in this embodiment. As shown in FIG. 1, around a central axis 21 that is defined for the entire silicon carbide diode which extends vertically, there are at least two first trenches 26 formed respectively by a first high barrier metal portion 30 and a second high barrier metal portion 32 (as shown by portions enclosed by two parallel dashed lines) extending downwardly into the silicon carbide layer 24. In other words, the first trenches 26 are filled with a high barrier metal. The two first trenches 26 preferably have the same dimensions. At the bottom of each first trenches 26 there is arranged a second lower barrier metal portion 34 that has a substantially strip shape. The second lower barrier metal portion 34 is also separated from the sidewall 26a of the first trench 26 (as shown in FIG. 4). In addition, on a top surface of the silicon carbide layer 24 surrounding the two first trenches 26, there are a number of first lower barrier metal portions 36 along a direction of the top surface of the silicon carbide layer 24. In FIG. 1 there are shown three such first lower barrier metal portions 36 and they are separated from each other. Each first lower barrier metal portion 36 has a width substantially the same as that of a first trench 26, and the width is larger than the depth of the first trench 26. In particular, between each two adjacent first lower barrier metal portions 36 there is either the first high barrier metal portion 30 or the second high barrier metal portion 32. The first high barrier metal portion 30 and the second high barrier metal portion 32 are therefore configured with the plurality of first lower barrier metal portions 36 in an alternating manner, and they are positioned along a same horizontal line (not shown). Note that the first lower barrier metal portions 36 are both offset from the second lower barrier metal portion 34 along a vertical direction and along a horizontal direction.

In addition, there is a higher barrier metal cap 22 formed on top of the first high barrier metal portion 30, the second high barrier metal portion 32 and the plurality of first lower barrier metal portions 36. The cap 22 together with the silicon carbide layer 24 fully encapsulates the first high barrier metal portion 30, the second high barrier metal portion 32 and the plurality of first lower barrier metal portions 36. In addition, although different part numbers are used for description of this embodiment, the higher barrier metal cap 22, the first high barrier metal portion 30, the second high barrier metal portion 32 and the two first trenches 24 all consist of the same high barrier metal so they together form an integral piece of material. The different part numbers are used only for the purpose of easy understanding of the geometrical structure of the Schottky barrier metals of the silicon carbide diode. The first high barrier metal portion 30, the second high barrier metal portion 32, the two first trenches 36 (with the second lower barrier metal portions 34) and the plurality of first lower barrier metal portions 36 together form an active region of the silicon carbide diode.

The higher barrier metal and lower barrier metal can be any suitable type of metal which attains to form a Schottky junction with the silicon carbide layer 24 and silicon carbide substrate 20. Examples of such materials include Titanium (Ti), Nickel (Ni), Titanium nitride (TiN), Titanium aluminum (TiAl), Platinum (Pt) and the like. However, as their plain meanings suggest the higher barrier metal in the silicon carbide diode should create a stronger junction barrier than the lower barrier metal.

Outside of the active region, in the silicon carbide layer 24 there are formed a plurality of second trenches 38 each filled with a dielectric material (not shown in FIG. 1). In FIG. 1, the number of second trenches 38 on the two sides of the active region is the same and the second trenches 38 are symmetrically arranged around the active region. The second trenches 38, similar to the first trenches 36 described above, extend downwardly from the top surface of the silicon carbide layer 24. The second trenches 38 and the first trenches 36 have substantially the same depth. However, one can see that along the horizontal direction of the top surface of the silicon carbide layer 24, different second trenches 38 have different width, and those closer to the active region have smaller widths compared to those further away from the active region. Inside the silicon carbide layer 24, surrounding each second trench 38 there is a buffer layer 40 at the interface between the second trench 38 and the silicon carbide layer 24. The buffer layer 40 is made of aluminum containing compound such as Aluminum Oxide ($Al_2O_3$) or Aluminum Nitride (AlN). In addition, adjacent second trenches 38 are separated from each other by a third higher barrier metal portion 42. The plurality of third higher barrier metal portions 42 are deposited on the top surface of the silicon carbide layer 24 and are along the same horizontal line as the first high barrier metal portion 30, the second high barrier metal portion 32, and the plurality of first lower barrier metal portions 36.

Figure 2A:
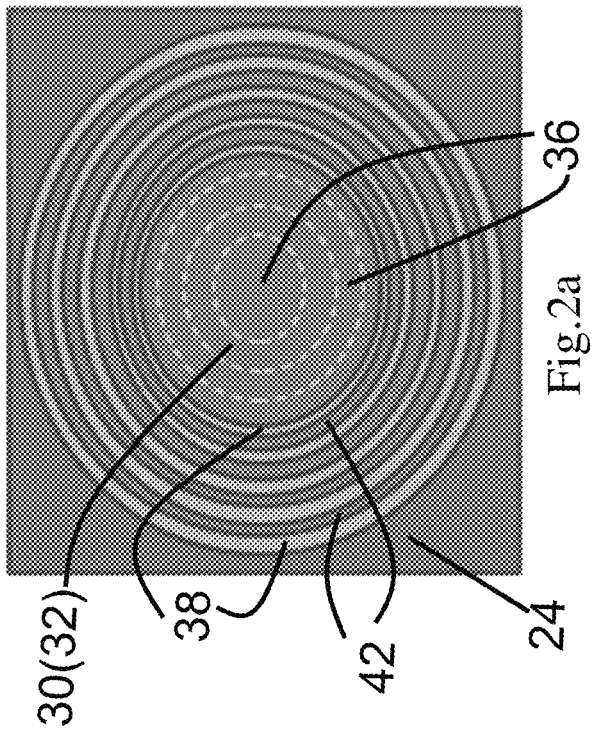
FIG. 2a is a top view of the layout of the silicon carbide diode in FIG. 1 showing second trenches and high barrier metals.

Note that the first trenches 26 are shown as separate parts in FIG. 1, but this is because FIG. 1 is a cross-sectional view of the diode structure. The two first trenches 26 are actually parts of a closed shape, and in particular an annual ring as shown in FIGS. 2a and 2b. When the silicon carbide diode is viewed in any cross-section along a vertical plane, the resultant view would be identical or similar to that in FIG. 1. Similar to the first trenches 26, the second lower barrier metal portion 34 are also parts of a single ring if viewed from top of the silicon carbide diode as shown in FIGS. 2a and 2b. Similarly, any two second trenches 38 in FIG. 1 that are symmetrical around the active region are also parts of a single ring if viewed from top of the silicon carbide diode as shown in FIGS. 2a and 2b. FIGS. 2a and 2b show clearly that in this embodiment there are five of second trenches 38 in closed shapes, and more particular in annual ring shapes. These annual rings are concentric. The annual ring of the first trenches 26 (as represented by the first high barrier metal portion 30/the second high barrier metal portion 32) is also concentric with those rings of the second trenches 38.

By implementing the above structure, the silicon carbide diode in this embodiment is particularly improved in its reversed breakdown voltage. Compared to traditional SiC diodes with 600V rating, the above silicon carbide diode can achieve a leakage current reduction greater than 40%, a blocking voltage improvement greater than 38%, but a manufacturing cost reduction by 44.2%. Such technical effects are achieved by the combination of the individual innovative features described above including but not limited to the first and second trenches, the combination of the lower barrier metal and higher barrier metal, the vertically offset lower barrier metal portions, the higher barrier metal portions between the second trenches, and the buffer layer around the second trench. However, it should be understood that each individual features can be used alone or in a limited combination with other features in other variations of the invention to achieve some effects, though not optimum. Below the performance improvements resulted by some of the individual features mentioned above will be explained.

Firstly, the hybrid Schottky structure in the silicon carbide diode of FIGS. 1-2b contains both the higher barrier metal and the lower barrier metal, which achieves a good balance between the blocking voltage (reverse bias) and onset voltage (forward bias). The high barrier metal termination helps achieve a high blocking voltage, and the low barrier metal active region helps achieve a high forward current. Obviously, it is important to achieve both a high forward current for normal operation of the diode conducting status, and a high blocking voltage to avoid the diode from breakdown when it is reversibly biased. In the silicon carbide diode of FIGS. 1-2, the higher barrier metal cap 22 provides terminations at the boundary of the active region so effectively the electrical field crowding may be reduced, thus reducing the leaking currents at the terminations. On the other side, different portions of lower barrier metal are deposited within the active region which help enabling a high forward current for the Schottky diode.

The arrangements of second trenches 38 outside the active region with dielectric materials, also help reduce the leakage current by reducing the electrical field crowding. Without the second trenches 38, the leakage currents find a much easier way to enter the Schottky metals in the active region from the silicon carbide layer 24. With the second trenches 38, there is a resistivity increment (e.g. in the magnitude of $10^{15}$ Ohms) with the filled dielectric materials in the second trenches 38, resulting in reduced leakage current. Therefore, there is less electrical field crowding at the termination of the active region of the silicon carbide diode.

In the silicon carbide diode above there are multiple rings of second trenches 38 and this further reduces the electrical field crowding at the terminations of the active region. Compared to the configuration of only one second trench 38, the plurality of second trenches 38 could achieve a reduction of the electrical field strength by at least 61%.

Figure 3A:
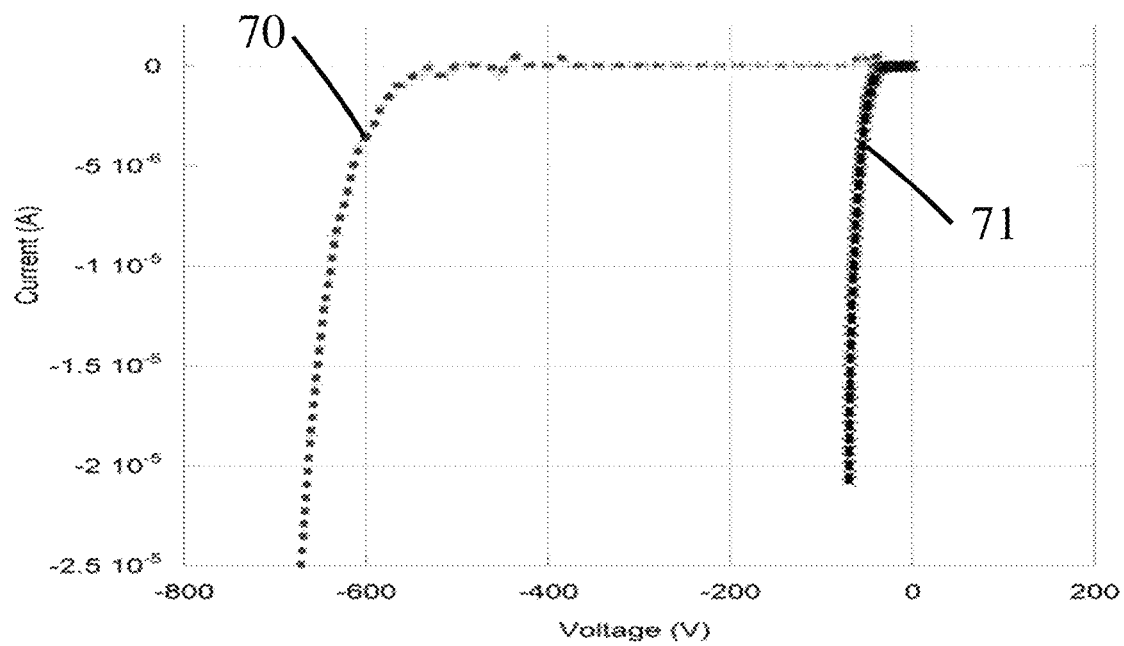
FIG. 3a shows the comparison of experimental results of reverse breakdown voltages of silicon carbide diodes using $SiO_2$ as passivation and $Al_2O_3$ as passivation respectively.
Figure 3B:
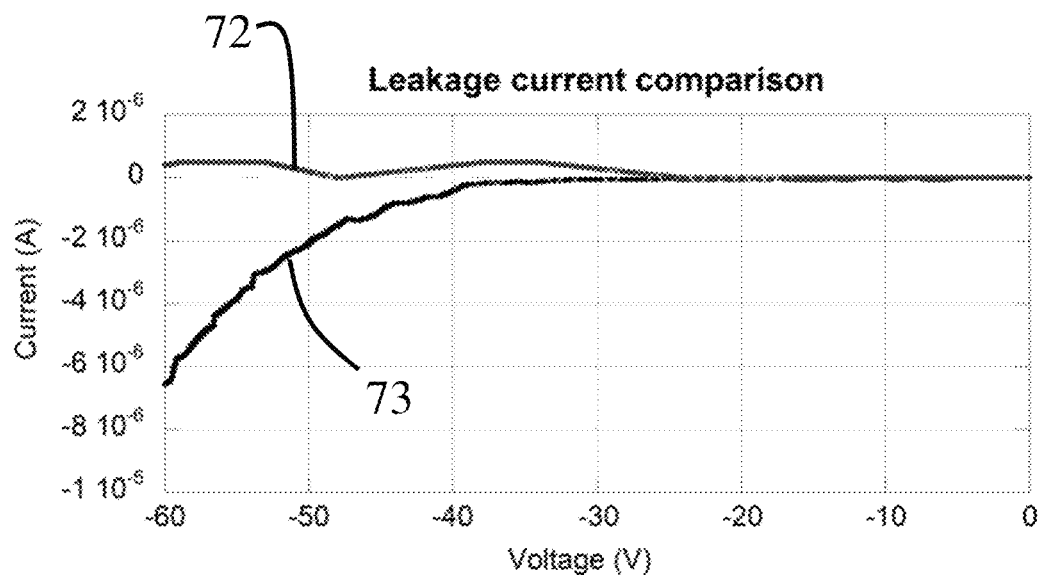
FIG. 3b shows the comparison of experimental results of leakage currents of silicon carbide diodes using $SiO_2$ as passivation and $Al_2O_3$ as passivation respectively.

In addition, the buffer layer 40 surrounding each second trench 38 in the silicon carbide diode above further decreases the leakage current on the basis of the second trench 38 itself already achieving this effect. Compared to conventional materials such as $SiO_2$ that is used as a buffer material, the Aluminum compound such as Aluminum Oxide ($Al_2O_3$) or Aluminum Nitride (AlN) results in less gaps and defects between the atoms of Al and Oxygen, making them tightly packed, therefore greatly reducing the leakage current. The comparison between $SiO_2$ passivation and $Al_2O_3$ passivation in the silicon carbide diode in terms of reverse breakdown voltage and leakage current are shown in FIGS. 3a and 3b respectively. By replacing the $SiO_2$ with the $Al_2O_3$ as passivation, the leakage current 73 in the case of $SiO_2$ is improved to the leakage current 72 in the case of $Al_2O_3$. The blocking voltage 71 in the case of $SiO_2$ which is less than 100V is significantly increased to being larger than 600V of the blocking voltage 70 in the case of $Al_2O_3$.

Turning to the active region, the silicon carbide diode in FIGS. 1-2b contains multiple first trenches 26 of hybrid Schottky metals. As shown in FIG. 4, under a reverse bias condition of the silicon carbide diode, the high Schottky barrier created by the higher barrier metal at sidewalls 26a of each first trench 26 creates a wider depletion region 48 in the silicon carbide layer 24, which is pinched-off to adjacent first trenches 26, and protects the plurality of first lower barrier metal portions 36 on the top surface of the silicon carbide layer 24. This is because most reverse currents from the silicon carbide substrate 20 will flow through the higher barrier metal at the sidewalls 26a of the first trenches 26 and also the second lower barrier metal portions 34 (where the current is represented by arrow 46) at the bottom of the first trenches 26. No or only a very small amount of reverse current (represented by arrow 48) is passing through the plurality of first lower barrier metal portions 36 because of the high barrier metal depletion pinched-off protection.

FIG. 5a-5j show sequential steps of an exemplary method of how to produce the silicon carbide diode array in FIGS. 1-2b. Note that the exemplary method described in this embodiment is not intended to be limiting, as the same silicon carbide diode may be produced using other methods, and/or with different sequences of the steps. The method starts in FIG. 5a in which a raw silicon carbide epi wafer which has been cleaned using the RCA clean procedures is prepared. The wafer comes with a silicon carbide substrate 20 of n+ type and a silicon carbide layer 24 on top thereof which is of n− type. Then, as shown in FIG. 5b, a layer of higher barrier metal 54 is deposited selectively on the top surface of the silicon carbide layer in a predetermined pattern. The results of the deposition include the third higher barrier metal portions 42 mentioned above, and also part of the higher barrier metal cap 22. As mentioned above the third higher barrier metal portions 42 come in the shape of multiple concentric annual rings. Also, as shown in FIG. 5b the ohmic metal 28 is deposited on the bottom surface of the silicon carbide substrate 20 and forms the cathode of the silicon carbide diode.

Next, as shown in FIG. 5c the silicon carbide layer 24 goes through an etching process, resulting in parts of the silicon carbide layer 24 not covered by Schottky metal etched to form both first trenches 26 and second trenches 38. As mentioned above the first trenches 26 and second trenches 38 come in the shape of concentric annual rings. Note that at this moment, nothing has been filled into first trenches 26 and second trenches 38. After the trenches are formed, some of the Schottky metal (which is the higher barrier metal as mentioned above) are removed from the top surface of the silicon carbide layer 24, and in particular on parts of the silicon carbide layer 24 between and surrounding the first trenches 26. Next, in FIG. 5d, firstly a layer of Atomic layer deposited (ALD) dielectric 51 (e.g. $Al_2O_3$) is deposited on the top surface of the silicon carbide layer 24 including the first trenches 26, the second trenches 38, and the third higher barrier metal portions 42, and then an oxide layer 50 is deposited on top of the dielectric layer 51.

Next, in FIG. 5e the silicon carbide layer 24 undergoes an oxide Reactive Ion Etching (RIE) process by which the previously deposited dielectric 51 and oxide 50 on the top surface of the silicon carbide layer 24 are removed, but not all the dielectric 51 and oxide 50 inside the first trenches 26 and the second trenches 38. Rather, there are residues of dielectric 51 and oxide 50 at the corner portions of the first trenches 26 (but not at the central area of the bottom of the first trenches 26). In comparison, there are residues of dielectric 51 and oxide 50 at both the corner portions and actually the entire bottom of the second trenches 38.

As shown in FIG. 5f, a layer of lower barrier metal 52 is deposited on the entire top surface of the silicon carbide layer 24 device, including the first trenches 26, the second trenches 38, and the third higher barrier metal portions 42. The layer of lower barrier metal 52 then undergoes an annealing process. The layer of lower barrier metal 52 will react with the silicon carbide layer 24 if they contact directly with each other, but for portions of the carbide layer 24 which are covered by the oxide 50 then there is no such reaction. Next, as shown in FIG. 5g any unreacted lower barrier metal 52 are removed from the device, including essentially all such lower barrier metal 52 outside of the active region. Next, as shown in FIG. 5h spacers inside the first trenches 26 which are actually the residues of oxide 50 are removed so that only the second lower barrier metal portions 34 remain inside the first trenches 26.

Consequently, as shown in FIG. 5i the higher barrier metal 54 is deposited on the active region of the device, patterned and then annealed, in order to fill the first trenches 26 and also to form the complete higher barrier metal cap 22. Finally, as shown in FIG. 5j oxide 50 is deposited in the second trenches 38 and patterned so that the oxide 50 becomes dielectric materials fully filling up the second trenches 38 and has a top face flush with the top surface of the silicon carbide layer 24. The silicon carbide diode is therefore manufactured.

Figure 6A:
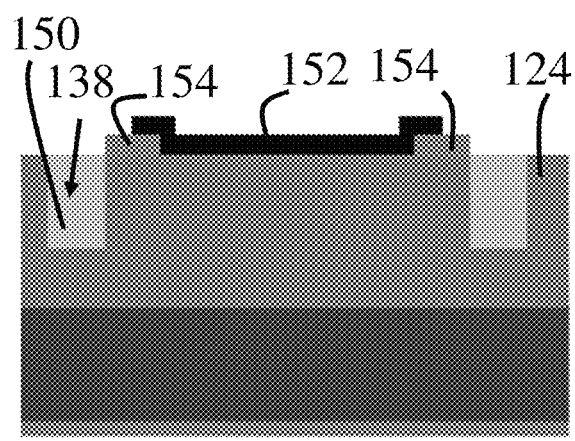
FIGS. 6a-6d show the cross-sectional illustrations of silicon carbide diodes according to some other embodiments of the invention.
Figure 6B:
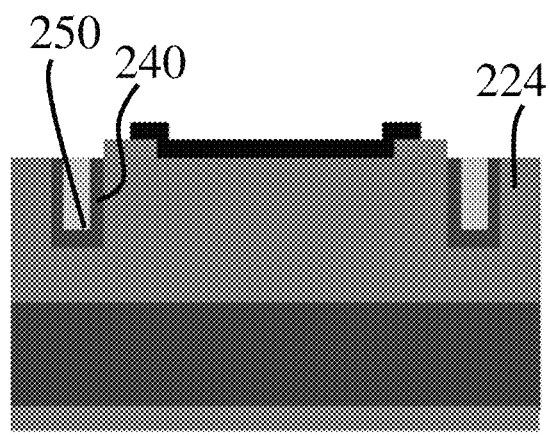
Figure 6C:
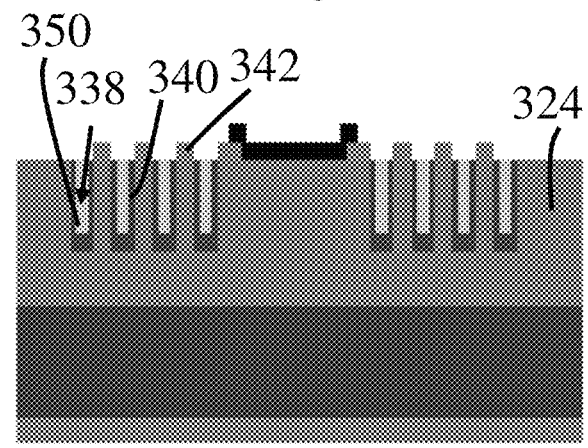
Figure 6D:
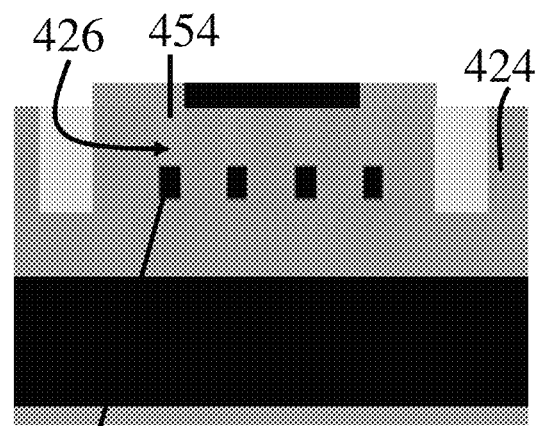

FIGS. 6a-6d show various other embodiments of the invention in which silicon carbide diodes are provided. For the sake of simplicity features of the silicon carbide diodes in FIGS. 6a-6d that are identical or similar to those in FIGS. 1-2b will not be described again herein. The silicon carbide diodes in FIGS. 6a-6d basically contain less features than that in FIGS. 1-2b, so their performance in terms of leakage current and reverse breakdown current are not so good as that of the silicon carbide diode in FIGS. 1-2b. Also, note that the cross-sections of the silicon carbide diodes in FIGS. 6a-6b may not be illustrated in the same aspect ratio as that in FIGS. 1-2b. In FIG. 6a, the silicon carbide diode contains no trench in the active region defined by the hybrid metals of a lower barrier metal 152 in the center and higher barrier metals 154 around the lower barrier metals 152. The lower barrier metal 152 further contains no gap or separation but rather it is an integral piece. Around the active region, there is a single ring of second trench 138 filled of dielectric material 150. The silicon carbide diode in FIG. 6b has a structure very similar to that of FIG. 6a. However, the difference between FIG. 6b and FIG. 6a is that the trenches 238 in FIG. 6b outside of the active region is surrounded by a buffer layer 240 at an interface between the dielectric material 250 and the silicon carbide layer 224. The silicon carbide diode in FIG. 6c is different from that in FIG. 6b in that it contains a plurality of trenches 338 within the silicon carbide layer 324 around the active region, with each of the trenches 338 having substantially the same dimension. Each trench 338 is filled with dielectric material 350 and is surrounded by a buffer layer 340. The plurality of trenches 338 forms multiple concentric annual rings around the active region. There is a plurality of high barrier metal 342 formed in between any two of the plurality of trenches 338 such that the metals 342 form enclosed multiple concentric annual rings in a top view. The silicon carbide diode in FIG. 6d is different from that in FIG. 6a in that it contains a plurality of trenches 426 in the silicon carbide layer 424 which are located within the active region (which are similar to the first trench described with reference to FIGS. 1-2b). Each trench 426 is filled with a higher barrier metal 454 and at the bottom of the trench 426 there is a layer of lower barrier metal 434. The plurality of trenches 426 forms multiple concentric annual rings within the active region.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

While the invention has been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

For example, the embodiments in FIGS. 1-6d are silicon carbide diodes with different trenches, and/or barrier metals that form concentric annual rings if viewed from the top. However, those skilled in the art should realize that other types of closed shape may also be formed by the trenches and/or barrier metals, such as oval, eclipse, rectangle, etc.

In addition, the embodiment in FIGS. 1-2b contains one ring of first trench, and five rings of second trenches, which all have roughly the same depth. Those skilled in the art can easily think of having different numbers of first trenches and/or second trenches in the silicon carbide diodes and they can have different dimensions than that in FIGS. 1-2b. For example, instead of second trenches closer to the active region having a smaller width than those farther from the active region, it could be that all second trenches have uniform width.

What is claimed is:

1. A silicon carbide diode, comprising:
   a) a silicon carbide substrate;
   b) a silicon carbide layer on top of the silicon carbide substrate, the silicon carbide layer being thinner and having lower doping than the silicon carbide substrate;
   c) two first lower barrier metal portions disposed on the silicon carbide layer and separated from each other along a top surface of the silicon carbide layer;
   d) a first higher barrier metal portion connected to the two first lower barrier metal portions;
   e) a second higher barrier metal portion; wherein the first higher barrier metal portion and the second higher barrier metal portion further extend downwardly into the silicon carbide layer to form two first trenches; and
   f) a second trench separated from an active region defined by the first higher barrier metal portion and the two first lower barrier metal portions; the second trench formed by a dielectric material;
   wherein the first and second higher barrier metal portions each create a stronger junction barrier than the first lower barrier metal portions;
   wherein the first higher barrier metal portion is located between the two first lower barrier metal portions on the silicon carbide layer along a direction of the top surface of the silicon carbide layer; the first and second higher barrier metal portions configured with the two first lower barrier metal portions in an alternating manner at the top surface of the silicon carbide layer, such that the first higher barrier metal portion and the second higher barrier metal portion are separated by one of the two first lower barrier metal portions.

2. The silicon carbide diode according to claim 1, further comprises second lower barrier metal portions located at the bottom ends of the first trenches; the second lower barrier metal portions each creating a weaker junction barrier than the first and second higher barrier metal portions.

3. The silicon carbide diode according to claim 1, further comprises a higher barrier metal cap, together with the silicon carbide layer, fully encapsulating the first lower barrier metal portions.

4. The silicon carbide diode according to claim 1, wherein the first higher barrier metal portion further extends downwardly into the silicon carbide layer to form a first trench.

5. The silicon carbide diode according to claim 1, further comprises a plurality of said second trenches which are separated from each other; each said second trench forming a closed shape when viewing from above.

6. The silicon carbide diode according to claim 5, wherein the plurality of said second trenches form a plurality of concentric rings.

7. The silicon carbide diode according to claim 5, wherein the plurality of said second trenches are separated from each other by one or more third higher barrier metal portions; the one or more third higher barrier metal portions creating or each creating a stronger junction barrier than the first lower barrier metal portions.

8. The silicon carbide diode according to claim 1, further comprises an aluminum compound buffer at an interface between the second trench and the silicon carbide layer.

9. The silicon carbide diode according to claim 1, further comprises:
   g) second lower barrier metal portions located at the bottom ends of the first trenches; the second lower barrier metal portions each creating a weaker junction barrier than the first and second higher barrier metal portions;
   h) a plurality of said second trenches which are separated from each other; each said second trench forming a closed shape when viewing from above; the plurality of said second trenches form a plurality of concentric rings; and
   i) an aluminum compound buffer at an interface between the second trench and the silicon carbide layer;
   wherein the plurality of said second trenches are separated from each other by one or more third higher barrier metal portions; the one or more third higher barrier metal portions creating or each creating a stronger junction barrier than the first lower barrier metal portions and the second lower barrier metal portions.

10. A silicon carbide diode, comprising:
   a) a silicon carbide substrate;
   b) a silicon carbide layer on top of the silicon carbide substrate, the silicon carbide layer being thinner and having lower doping than the silicon carbide substrate;
   c) an active region defined by at least one barrier metal which is formed on the silicon carbide layer; and
   d) a plurality of trenches formed inside the silicon carbide layer, and separated from the active region along a direction of a top surface of the silicon carbide layer; wherein each said trench forming a closed shape when viewing from above; and each said trench formed by a dielectric material; and
   e) a plurality of the barrier metal formed on the silicon carbide layer outside the active region; wherein each said barrier metal forming a closed shape and being located in between two of the plurality of trenches in when viewing from above.

11. The silicon carbide diode of claim 10, further comprises an aluminum compound buffer at an interface between the second trench and the silicon carbide layer.

12. A method of producing a silicon carbide diode, comprising the steps of:
   a) providing a silicon carbide layer on top of a silicon carbide substrate; the silicon carbide layer being thinner and having lower doping than the silicon carbide substrate;
   b) forming two first trenches and a second trench inside the silicon carbide layer; the first trenches being part of an active region of the silicon carbide diode; the second trench separated from the first trench and formed by a dielectric material;
   c) depositing a lower barrier metal on a top surface of the silicon carbide layer in the active region to form two first lower barrier metal portions separated by one of the first trenches; and
   d) depositing a higher barrier metal on the top surface of the silicon carbide layer in the active region, which fills the first trenches thus forming a first higher barrier metal portion and a second higher barrier metal portion;
   wherein the first and second higher barrier metal portions each create a stronger junction barrier than the first lower barrier metal portions;
   wherein the first higher barrier metal portion is located between the two first lower barrier metal portions on the silicon carbide layer along a direction of the top surface of the silicon carbide layer; the first and second higher barrier metal portions configured with the two first lower barrier metal portions in an alternating manner at the top surface of the silicon carbide layer, such that the first higher barrier metal portion and the second higher barrier metal portion are separated by one of the two first lower barrier metal portions.

13. The method according to claim 12, wherein step b) further comprises forming a plurality of second trenches that are separated from the first trenches and from each other, each said second trench forming a closed shape.

14. The method according to claim 13, wherein step d) further comprises the depositing the higher barrier metal on portions of the silicon carbide layer surrounding openings of the plurality of second trenches.

15. The method according to claim 12, wherein step c) further comprises the step of depositing the lower barrier metal on a bottom surface of each of the first trenches, as well as on portions of the silicon carbide layer surrounding an opening of each of the first trenches.

16. The method according to claim 12, further comprises the step of filling the first trenches with the higher barrier metal.

17. The method according to claim 12, further comprises the step of filling the second trench with a dielectric material.

18. The method according to claim 17, further comprises the step of forming a buffer layer at the interface between the second trench and the silicon carbide layer.

\* \* \* \* \*